United States Patent
Liu et al.

(10) Patent No.: US 9,034,706 B2
(45) Date of Patent: May 19, 2015

(54) FINFETS WITH REGROWN SOURCE/DRAIN AND METHODS FOR FORMING THE SAME

(71) Applicant: Taiwan Semiconductor Manufacturing Company, Ltd., Hsin-Chu (TW)

(72) Inventors: Eric Chih-Fang Liu, Taipei (TW);
Tzu-Wei Kao, Baoshan Township (TW);
Ryan Chia-Jen Chen, Chiaya (TW);
Chao-Cheng Chen, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/866,925

(22) Filed: Apr. 19, 2013

(65) Prior Publication Data
US 2014/0273380 A1 Sep. 18, 2014

Related U.S. Application Data

(60) Provisional application No. 61/780,834, filed on Mar. 13, 2013.

(51) Int. Cl.
*H01L 21/336* (2006.01)
*H01L 29/78* (2006.01)
*H01L 29/66* (2006.01)

(52) U.S. Cl.
CPC ............... *H01L 29/66795* (2013.01)

(58) Field of Classification Search
CPC ............ H01L 21/823814; H01L 29/0869; H01L 29/41766; H01L 29/66621; H01L 29/66636; H01L 29/7848
USPC ............ 438/300, 429, 442; 257/E21.545, 257/E21.585, E29.121
See application file for complete search history.

(56) References Cited

U.S. PATENT DOCUMENTS

| 6,794,313 | B1 | 9/2004 | Chang | |
|---|---|---|---|---|
| 2013/0134506 | A1* | 5/2013 | Yagishita | 257/330 |
| 2013/0140576 | A1* | 6/2013 | Mieno et al. | 257/66 |

OTHER PUBLICATIONS

Narayan, J. and Holland, O. W., Solid-Phase-Epitaxial Growth in Ion-Implanted Silicon. Physica Status Solidi (a), vol. 73, Issue 1, pp. 225-236.*

* cited by examiner

*Primary Examiner* — Brett Feeney
*Assistant Examiner* — Pamela E Perkins
(74) *Attorney, Agent, or Firm* — Slater & Matsil, L.L.P.

(57) ABSTRACT

A method includes etching a semiconductor substrate to form a recess in the semiconductor substrate, and reacting a surface layer of the semiconductor substrate to generate a reacted layer. The surface layer of the semiconductor substrate is in the recess. The reacted layer is then removed. An epitaxy is performed to grow a semiconductor material in the recess.

20 Claims, 8 Drawing Sheets

FINFETS WITH REGROWN SOURCE/DRAIN AND METHODS FOR FORMING THE SAME

This application claims the benefit of the following provisionally filed U.S. patent Application Ser. No. 61/780,834, filed Mar. 13, 2013, and entitled "FinFETs with Regrown Source/Drain and Methods for Forming the Same," which application is hereby incorporated herein by reference.

BACKGROUND

Reduction of the size and the inherent features of semiconductor devices (e.g., Metal-Oxide Semiconductor (MOS) devices) has enabled continued improvement in speed, performance, density, and cost per unit function of integrated circuits over the past few decades. In accordance with a design of the MOS devices and one of the inherent characteristics thereof, modulating the length of a channel region underlying a gate between a source and drain of a MOS device alters a resistance associated with the channel region, thereby affecting a performance of the MOS device. More specifically, shortening the length of the channel region reduces a source-to-drain resistance of the MOS device, which, assuming other parameters are maintained relatively constant, may allow an increase in current flow between the source and drain when a sufficient voltage is applied to the gate of the MOS device.

To further enhance the performance of MOS devices, stress may be introduced in the channel region of a MOS device to improve carrier mobility. Generally, it is desirable to induce a tensile stress in the channel region of an N-type MOS ("NMOS") device in a source-to-drain direction, and to induce a compressive stress in the channel region of a P-type MOS ("PMOS") device in a source-to-drain direction.

A commonly used method for applying compressive stress to the channel regions of PMOS devices is growing silicon germanium (SiGe) stressors in the source and drain regions. Such a method typically includes the steps of forming a gate stack on a semiconductor substrate, forming spacers on sidewalls of the gate stack, forming recesses in the silicon substrate along gate spacers, epitaxially growing SiGe stressors in the recesses, and annealing. Since SiGe has a greater lattice constant than silicon, it expands after annealing and applies a compressive stress to the channel region, which is located between a source SiGe stressor and a drain SiGe stressor.

To further increase the drive current, Fin Field-Effect Transistors (FinFETs) were developed. FinFETs have increased channel widths. The increase in the channel widths is achieved by forming channels that include portions on the sidewalls of semiconductor fins and portions on the top surfaces of the semiconductor fins. Since the drive currents of transistors are proportional to the channel widths, the drive currents of the FinFETs are increased over planar transistors. Methods for forming FinFETs with the stressors are thus being studied.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable concepts that can be embodied in a wide variety of specific contexts. The specific embodiments discussed are illustrative, and do not limit the scope of the disclosure.

A Fin Field-Effect Transistor (FinFET) and the method of forming the same are provided in accordance with various exemplary embodiments. The intermediate stages of forming the FinFET are illustrated. The variations of the embodiments are discussed. Throughout the various views and illustrative embodiments, like reference numbers are used to designate like elements.

Figure 1:
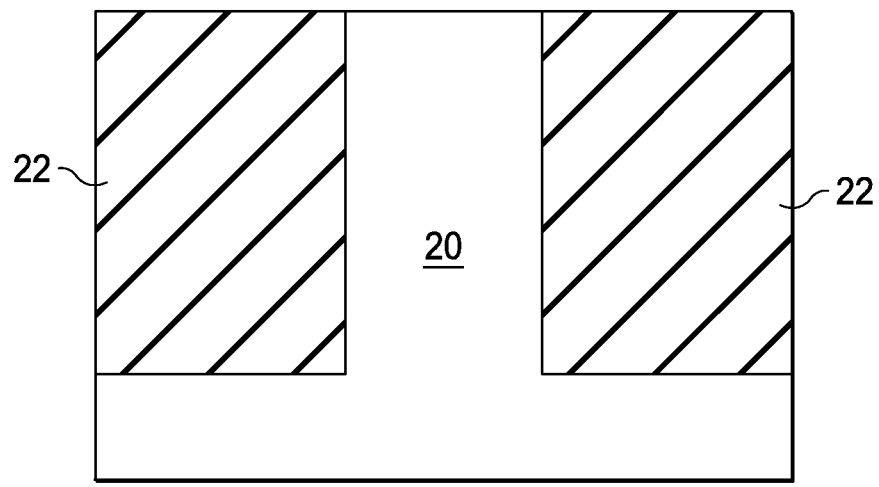
FIGS. 1 through 11 are cross-sectional views of intermediate stages in the manufacturing of a Fin Field-Effect Transistor (FinFET) in accordance with various embodiments.

FIGS. 1 through 11 illustrate the cross-sectional views of intermediate stages in the manufacturing of a Fin Field-Effect Transistor (FinFET) in accordance with various embodiments. Referring to FIG. 1, substrate 20 is provided. Substrate 20 may be a semiconductor substrate such as a crystalline silicon substrate. Substrate 20 may also include silicon, germanium, carbon, or the like. Isolation regions such as Shallow Trench Isolation (STI) regions 22 are formed in substrate 20. STI regions 22 may be formed by recessing semiconductor substrate 20 to form trenches, and then filling the trenches with dielectric materials such as silicon oxide. A Chemical Mechanical Polish (CMP) is then performed to remove excess portions of the dielectric materials, and the remaining portions of the dielectric materials are STI regions 22. The top surfaces of STI regions 22 are thus level with the top surface of substrate 20.

STI regions 22 include neighboring regions having their sidewalls facing each other. A portion of substrate 20 is located between, and in contact with, the neighboring STI regions. The neighboring STI regions may be separate regions physically spaced apart from each other, or may be portions of a continuous region, which may form a STI ring (in the top view) in some embodiments.

Figure 2:
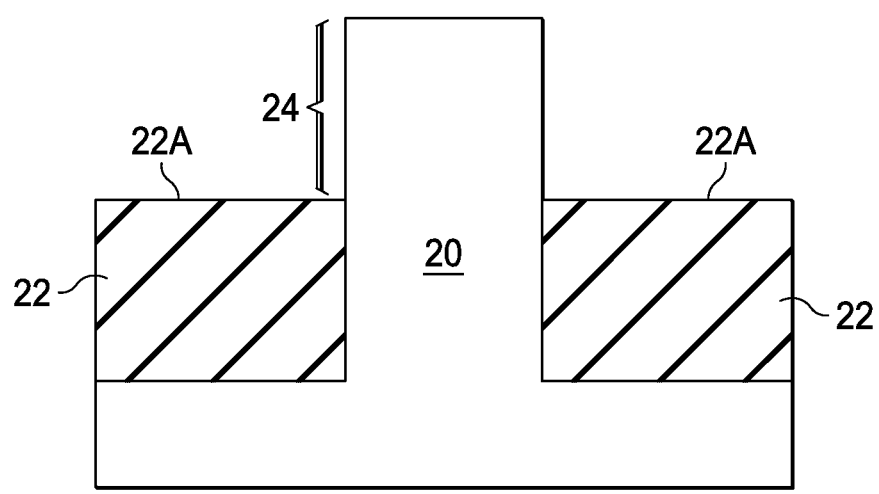
Figure 3:
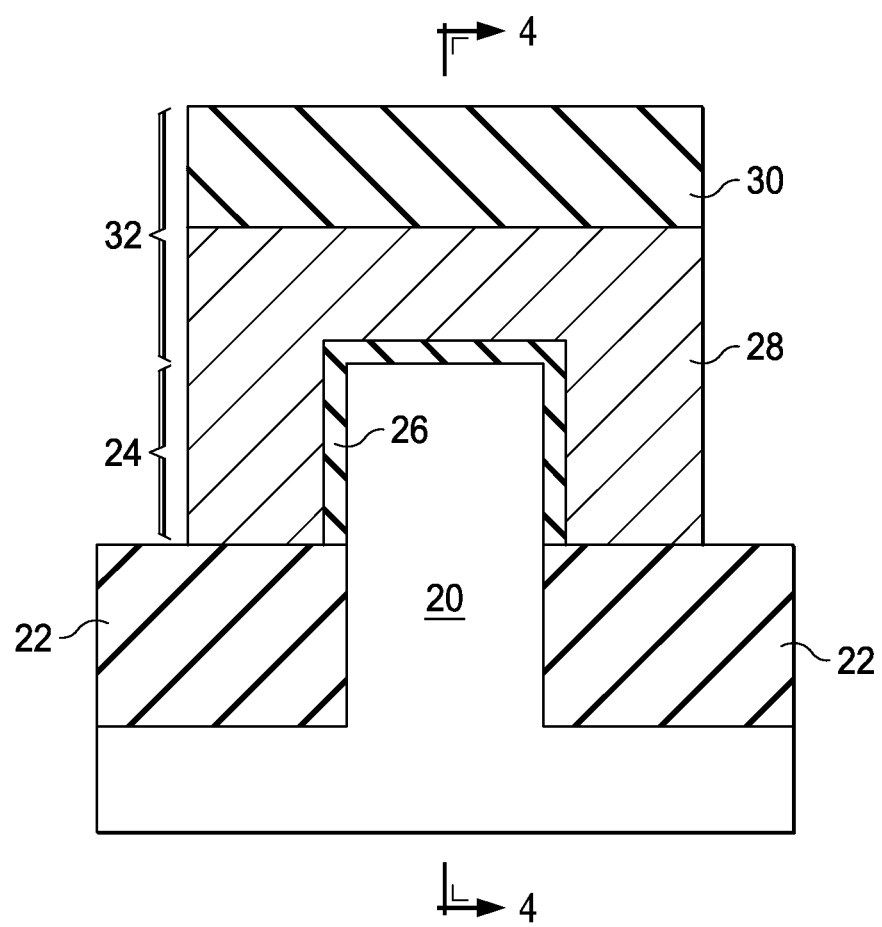

Referring to FIG. 2, STI regions 22 are recessed, for example, through an etching step. The portion of semiconductor substrate 20 that is higher than top surfaces 22A are referred to as semiconductor fin 24 hereinafter. Next, as shown in FIG. 3, gate stack 32, which includes gate dielectric 26, gate electrode 28, and mask layer 30, is formed. Gate dielectric 26 may be in contact with the sidewalls and the top surface of semiconductor fin 24. Gate dielectric 26 may comprise silicon oxide, silicon nitride, and/or high-k dielectric materials having high k values, for example, higher than about 7. The high-k dielectric materials may include Hf, $HfO_3$, $ZrO_2$, $LaO_3$, $Al_2O_3$, or the like. Gate electrode 28 is formed over gate dielectric 26, and may include conductive materials such as amorphous silicon, doped polysilicon, metals, metal silicides, metal nitrides, and combinations thereof. Mask layer 30 may include silicon nitride, silicon oxide, silicon carbide, silicon oxynitride, or other applicable materials. Furthermore, the material of mask layer 30 is such selected so that in the steps in FIGS. 5 through 9, mask layer 30 is not etched.

Figure 4:
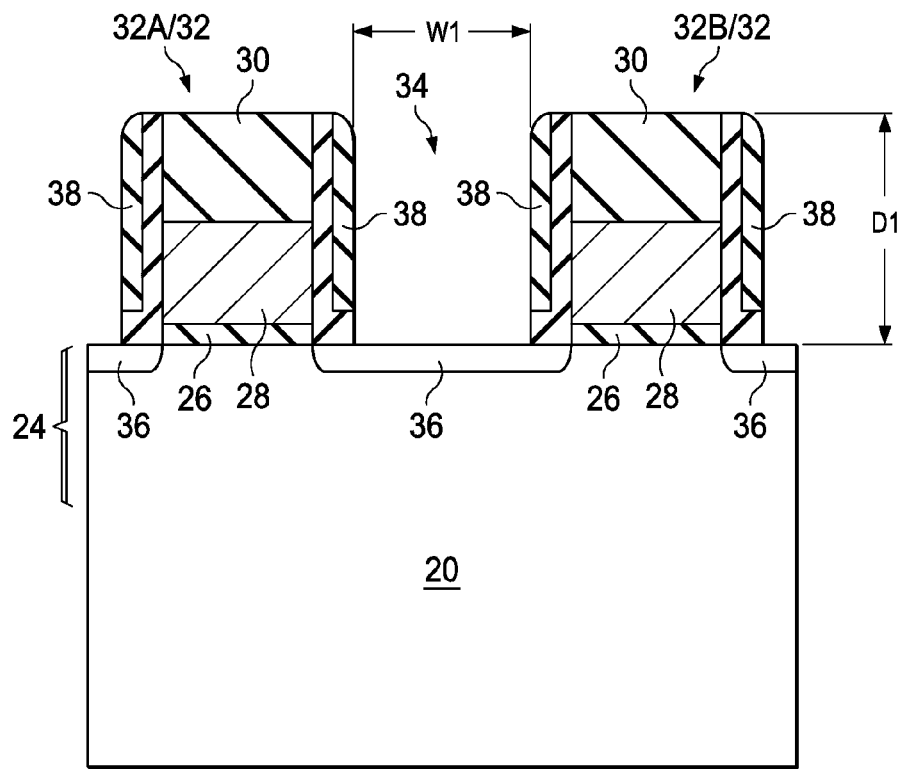

FIG. 4 illustrates the cross-sectional view of the structure shown in FIG. 3, wherein the cross-sectional view in FIG. 4 is obtained from the plane crossing line 4-4 in FIG. 3. As shown in FIG. 4, gate stacks 32 (including 32A and 32B) are located close to each other, with gap 34 therebetween. The gate stack 32 in FIG. 3 may be either one of gate stacks 32A and 32B. Gap 34 has depth D1 and width W1, wherein aspect ratio D1/W1 may be greater than about 6.0 in some exemplary embodiments.

As also shown in FIG. 4, Lightly Doped Drain/source (LDD) region 36 is formed, for example, by implanting a surface portion of substrate 20. The implanted impurity may be a p-type impurity or an n-type impurity, depending on whether the resulting FinFET is a p-type FinFET or an n-type FinFET. Gate stacks 32A and 32B act as the implantation mask so that the edges of LDD regions 36 are substantially aligned with the edges of gate stacks 32A and 32B.

FIG. 4 also illustrates the formation of gate spacers 38. In some embodiments, each of gate spacers 38 includes a liner oxide layer and a nitride layer over the liner oxide layer. In alternative embodiments, each of gate spacers 38 may include one or more layers, each comprising oxide, silicon nitride, silicon oxynitride and/or other dielectric materials, and may be formed using a deposition method, such as Plasma Enhanced Chemical Vapor Deposition (PECVD), Low-Pressure Chemical Vapor Deposition (LPCVD), Sub-Atmospheric Chemical Vapor Deposition (SACVD), or the like. The formation of gate spacers 38 may include blanket forming gate spacer layers, and then performing etching steps to remove the horizontal portions of the gate spacer layers. The remaining vertical portions of the gate spacer layers form gate spacers 38.

Figure 5:
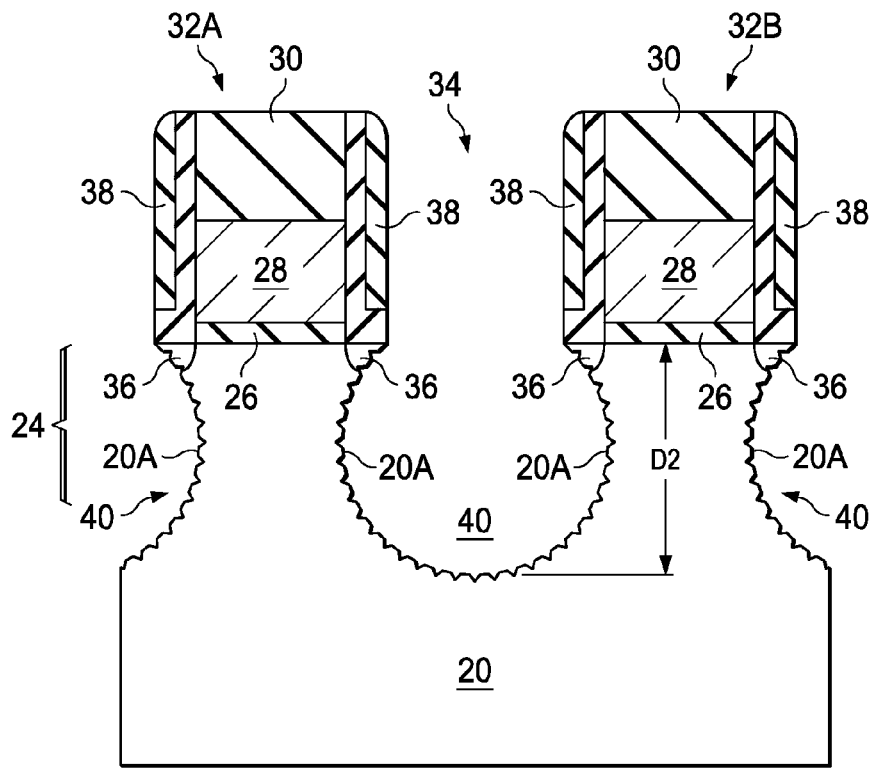
Figure 12:
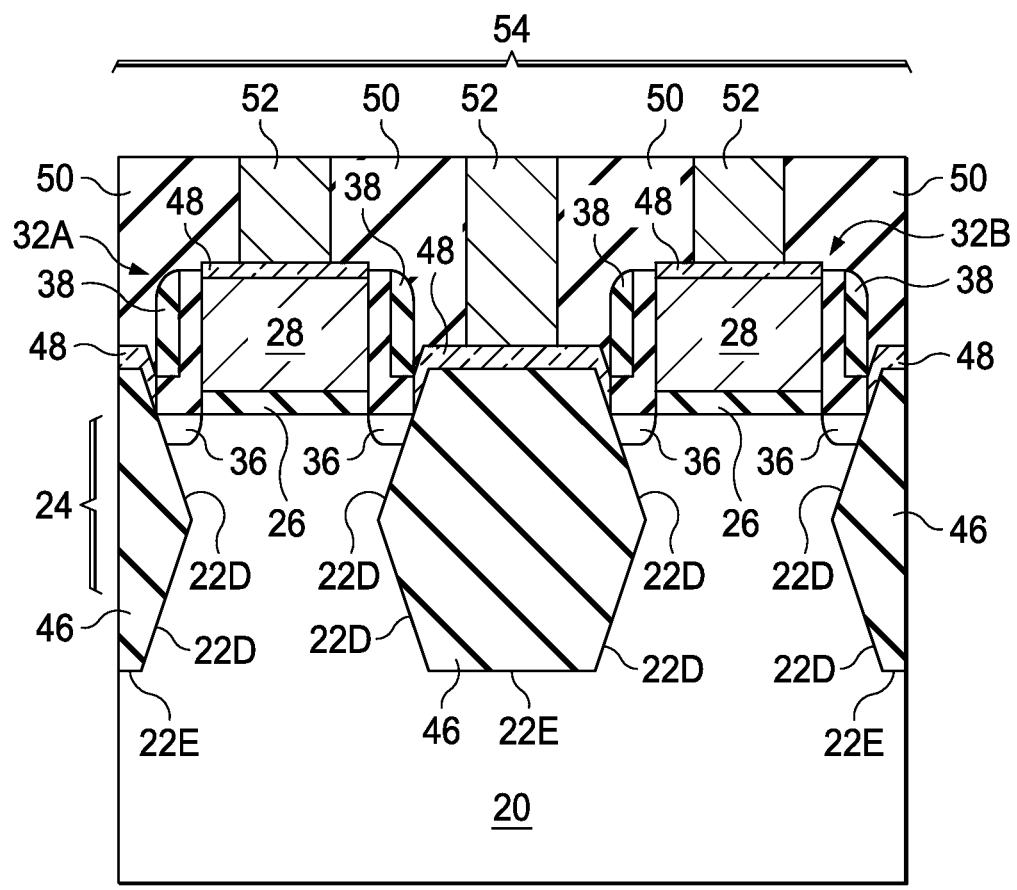
FIG. 12 illustrates a FinFET in accordance with alternative embodiments, wherein the epitaxy regions in the FinFET have cross-sectional view shapes different from the FinFET shown in FIG. 11.

Referring to FIG. 5, recesses 40 are formed by etching substrate 20. Gate stacks 32A and 32B act as an etching mask in the formation of recesses 40. Depth D2 of recesses 40 may be between about 500 Å and about 1,000 Å, although different depth D2 may also be used. One skilled in the art will realize, however, that the dimensions recited throughout the description are merely examples, and will change if different formation technologies are used. In the illustrated embodiments, recesses 40 have rounded cross-sectional shapes. In other embodiments, recesses 40 have diamond shapes in the cross-sectional view, and an example is shown in FIG. 12. The cross-sectional view shape of recesses 40 are determined by various factors such as the crystal orientation of substrate 20, the type of etchant, the etching conditions, and the like.

The etching of substrate 20 may be performed through dry etch, for example. The etching gas may be selected from, for example, HBr, $Cl_2$, $Cl_4$, $SF_6$, $NF_3$, $CH_2F_2$, $N_2$, $O_2$, Ar, He, and combinations thereof. The etching gas may be a single-etching step or may include a plurality of etching steps. In the recessing step, the plasma of the etching gas is generated. After the formation of recesses 40, surfaces 20A of substrate 20 are exposed to recesses 40, which surfaces 20A are inside recesses 40. Surfaces 20A may have a high roughness, which may be caused partially by the high aspect ratio of gap 34. The high roughness may cause the variation in the volumes of recesses 40 throughout the respective die and wafer, and in turn cause the variation in the stresses in the channels of the FinFETs. As a result, the high roughness may cause the variation in the performance (such as the variation in drive currents) of the FinFETs. Hence, process conditions for the etching are adjusted to reduce the roughness in the surfaces 20A of the substrate 20. For example, the pressure of the etching gas, the bias voltage, the temperatures of substrate 20, the magnetic field for generating the plasma, and the like, may be adjusted, so that the roughness of surfaces 20A is reduced.

Although the roughness may be reduced through the adjustment of etching process conditions, the roughness may still be high.

Figure 6:
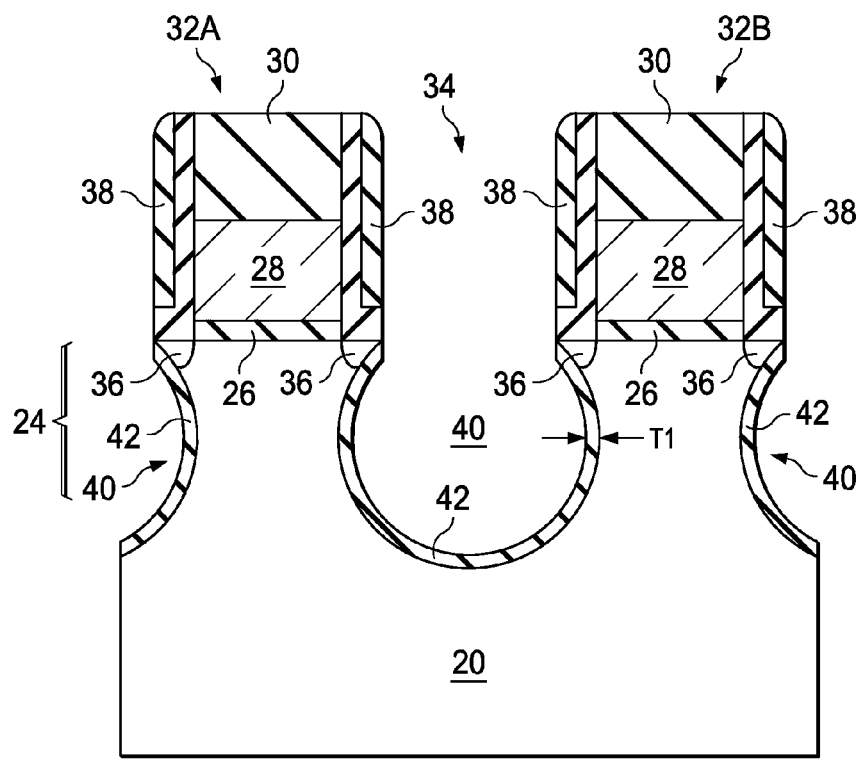

Referring to FIG. 6, after the formation of recesses 40, an oxidation or nitridation of the surfaces 20A is performed, and hence reacted layers 42 are formed in recesses 40. Throughout the description, the oxidation or nitridation is referred to as an oxidation/nitridation step, indicating that it is either an oxidation or a nitridation. The oxidation/nitridation is also referred to as a reaction of the surface layers of substrate 20, which surface layers are in recesses 40. The formation of recesses 40 and the oxidation/nitridation step may be performed in a same process chamber or in different process chambers. In some embodiments, formation of recesses 40 and the oxidation/nitridation step are in-situ performed in the same process chamber.

In some embodiments, the oxidation/nitridation step is an oxidation step, and hence the resulting reacted layers 42 comprise oxide layers, which are formed as a result of the oxidation of the surface layers of substrate 20, which surface layers are also in recesses 40. The process gas for the oxidation may include oxygen ($O_2$), ozone ($O_3$), $SO_x$ (such as $SO_2$), $HeO_2$, $SiCl_x$ (such as $SiCl_4$), Ar, He, or combinations thereof. In the oxidation process, a Transform Plasma Power (TCP) source (not shown) may be used to generate a magnetic field, which is used to generate plasma from the process gas. As a result, radicals and/or ions are generated from the process gas. For example, oxygen radicals may be generated when the process gas comprises $O_2$, while oxygen ions may be generated when the process gas comprises $SO_x$.

In alternative embodiments, the oxidation/nitridation step is a nitridation step, and hence the reacted layers 42 comprise nitride layers formed as a result of the nitridation of the surface layers of substrate 20. Reacted layers 42 comprise silicon nitride layers when substrate 20 is a silicon substrate. The process gas for the nitridation may include nitrogen ($N_2$), and may further comprise Ar, He, or combinations thereof. In the nitridation process, a TCP source (not shown) may be used to generate a magnetic field, which is used to generate plasma from the process gas. As a result, radicals and/or ions of nitrogen are generated from the process gas. For example, nitrogen radicals may be generated when the process gas comprises $N_2$.

In some embodiments, the process conditions for the oxidation/nitridation are adjusted, so that thick reacted layers 42 are generated. For example, the pressure of the process gas, the bias voltage, the temperatures of substrate 20, the magnetic field for generating the plasma, and the like, may be adjusted to increase thickness T1 of reacted layers 42. Thickness T1 may be greater than about 15 Å in some embodiments.

In the oxidation/nitridation, rough surface tend to be oxidized or nitridized at a greater rate than smooth surfaces, partially because the protruding portions of the rough surfaces have larger areas exposed to the radicals and ions of oxygen or nitrogen.

Figure 7:
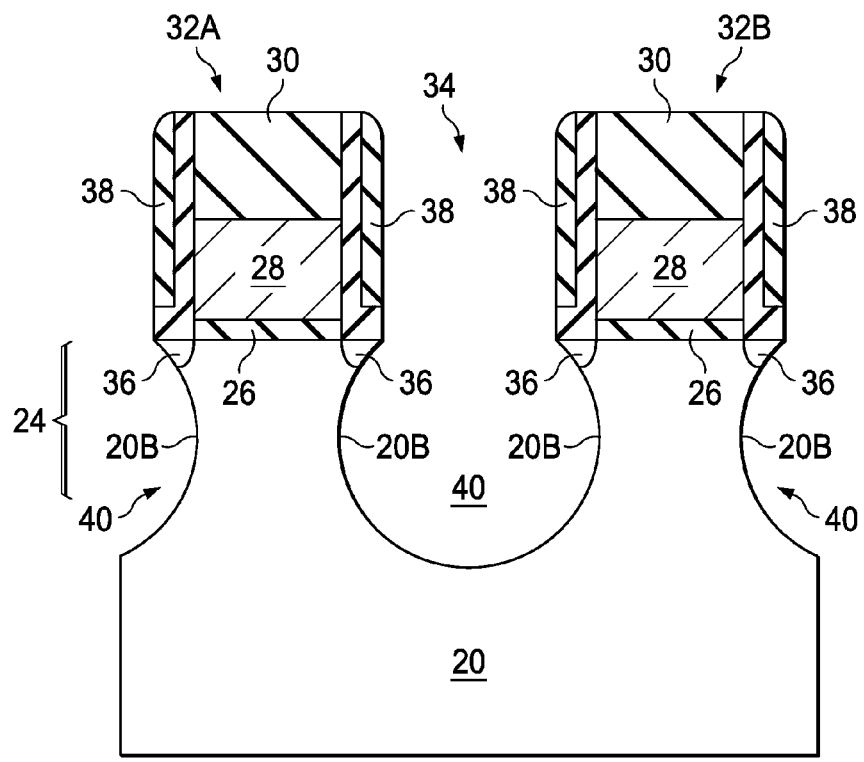

Next, as shown in FIG. 7, reacted layers 42 are removed, for example, through a wet etch step. The chemical for the wet etch may be selected from, for example, a solution of HF, $NH_4OH$, Tetra-Methyl Ammonium Hydroxide (TMAH), Sulfuric-acid hydrogen Peroxide Mixture (SPM), Ammonia hydrogen Peroxide Mixture (APM), and the like. The resulting surfaces of substrate 20, which surfaces are exposed to recesses 40, are denoted as surfaces 20B. Surfaces 20B are smoother than surfaces 20A in FIG. 5 due to the higher degree of oxidation/nitridation of the rough surfaces than the smooth surfaces.

Figure 8:
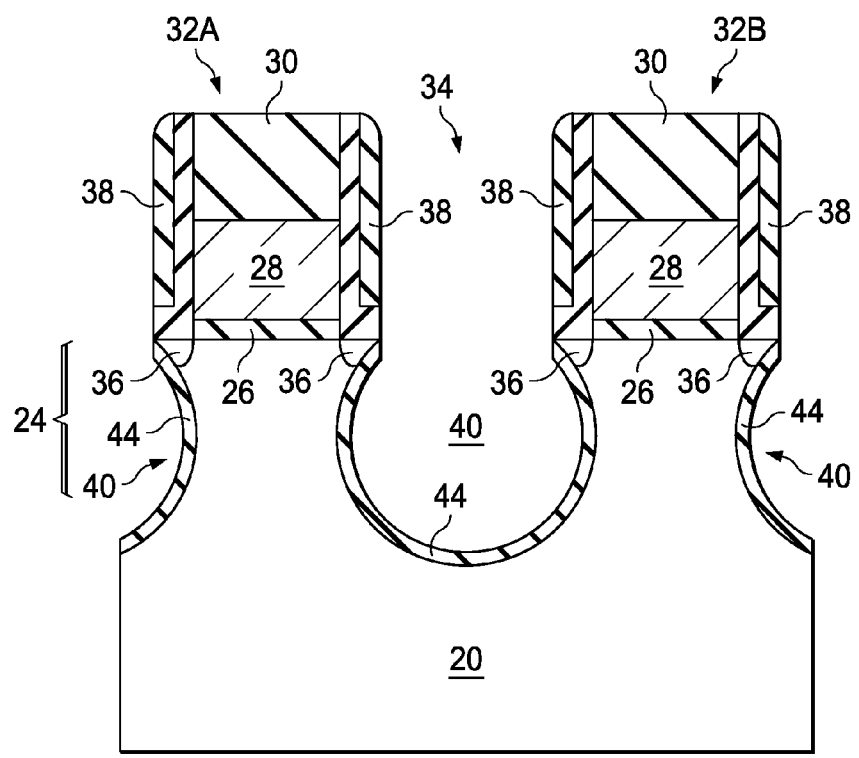
Figure 10:
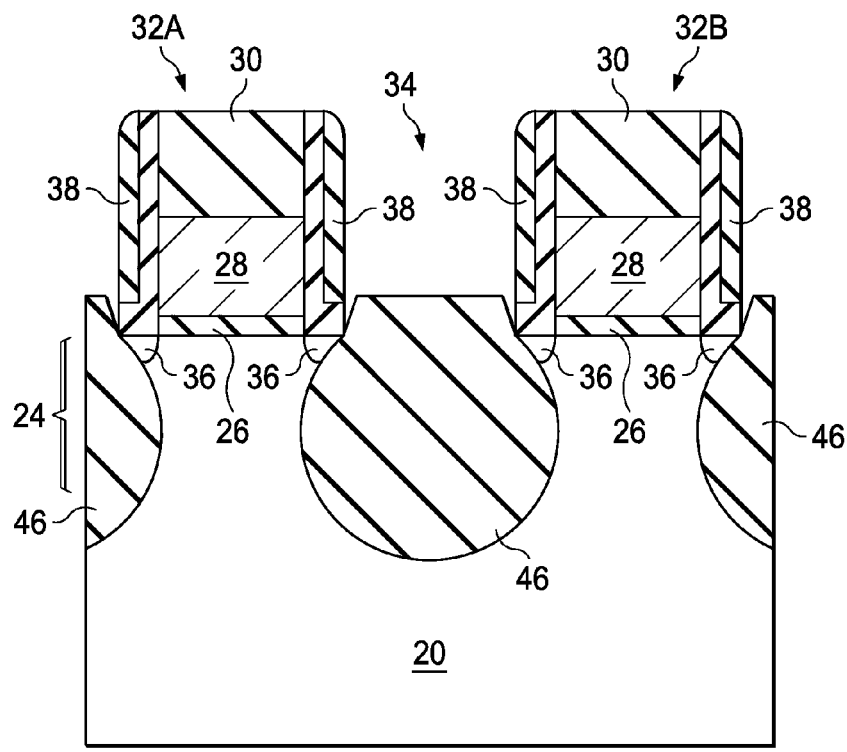

In accordance with some embodiments, after the removal of reacted layers 42, the resulting wafer is sent into a process chamber for performing epitaxy, as shown in FIG. 10. In alternative embodiments, as shown in FIG. 8, after the removal of reacted layers 42, an additional oxidation/nitridation is performed, and oxide/nitride layers 44 are formed as a result of the oxidation/nitridation of a surface portion of substrate 20. In some embodiments, oxide/nitride layers 44 are formed in the same process chamber for the wet etching, although they can be performed in different environments. The additional oxidation/nitridation may be performed using similar process gases, and using similar process conditions as the formation of reacted layers 42, as shown in FIG. 6. Alternatively, an oxidant such as ozone water or hydrogen peroxide may be used to oxidize surfaces 20B in FIG. 7. The additional oxidation/nitridation may be performed in the same process chamber that is used for the wet etch in FIG. 7.

Figure 9:
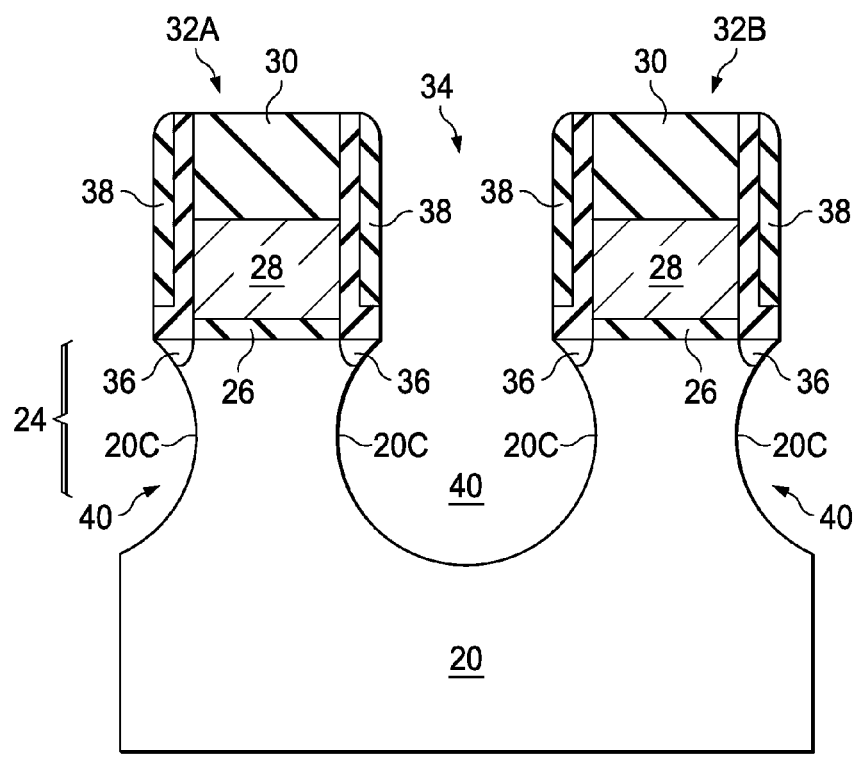

Oxide/nitride layers 44 are then removed, and the resulting structure is shown in FIG. 9. The resulting surfaces 20C of substrate 20 are smoother than both surfaces 20A (FIG. 5) and 20B (FIG. 7). In a subsequent description, an oxidation/nitridation step for forming the oxide/nitride layers and the subsequent removal of the oxide/nitride layers in combination is referred to as a cycle. The cycle may be repeated. With each of the repetition of the cycle, the surface roughness of the surfaces 20A is reduced more. The repetition may be stopped when the surface roughness reaches a desirable specification.

In subsequent process steps, as shown in FIG. 10, a semiconductor material, such as silicon germanium (SiGe), is epitaxially grown in recesses 40 to form epitaxy semiconductor regions 46. The epitaxy may be a Selective Epitaxial Growth (SEG) process, in which the semiconductor material is grown in recesses 40, and not on dielectric materials. Semiconductor regions 46 may have a lattice constant greater than the lattice constant of silicon substrate 20. The precursor for growing SiGe may include germane ($GeH_4$, which provides germanium), dichloro-silane (DCS, which provides silicon), and the like. Desired p-type or n-type impurities may be, or may not be, doped while the epitaxial growth proceeds. After being annealed, SiGe will try to restore its lattice constant, thus introducing compressive stresses to the channel regions of the resulting PMOS devices. Throughout the description, the SiGe epitaxy regions are alternatively referred to as SiGe stressors. In alternative embodiments, other semiconductor materials such as silicon carbon (SiC) may be grown to generate tensile stress in the channels of the resulting FinFETs, which may be n-type FinFETs.

Figure 11:
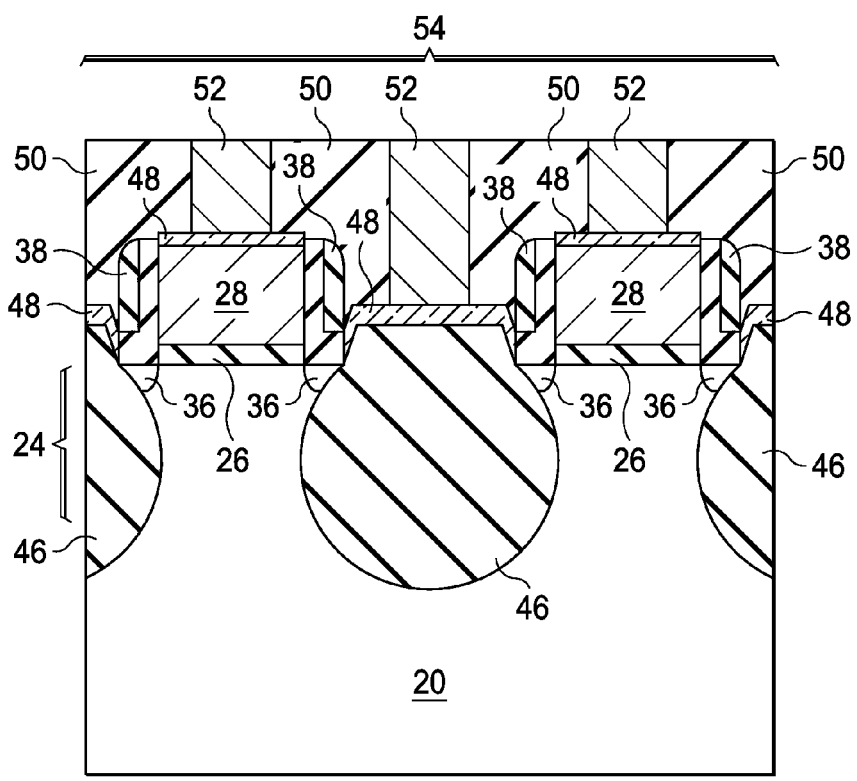

In a subsequent step, mask layers 30 are removed. The resulting structure is shown in FIG. 11. Silicide regions 48, Inter Layer Dielectric (ILD) 50, and contact plugs 52 are formed to finish the formation of FinFET 54. In the above-discussed embodiments, the formation of FinFET 54 is used as an example to explain the concept of the present disclosure. The embodiments may also be applied on planar MOS devices, which also include stressors. The surfaces of the recesses, which recesses are for forming the stressors of the planar MOS devices, may be smoothened using the methods shown in FIGS. 6 through 9.

FIG. 12 illustrates FinFET 54 in accordance with alternative embodiments. FinFET 54 in accordance with these embodiments is essentially the same as in the embodiments shown in FIG. 11, except the cross-sectional views of epitaxy semiconductor regions 46 have diamond shapes. In these embodiments, surfaces 22D may be on (111) planes of substrate 20, while surfaces 22E may be on a (001) plane of substrate 20.

Figure 13:
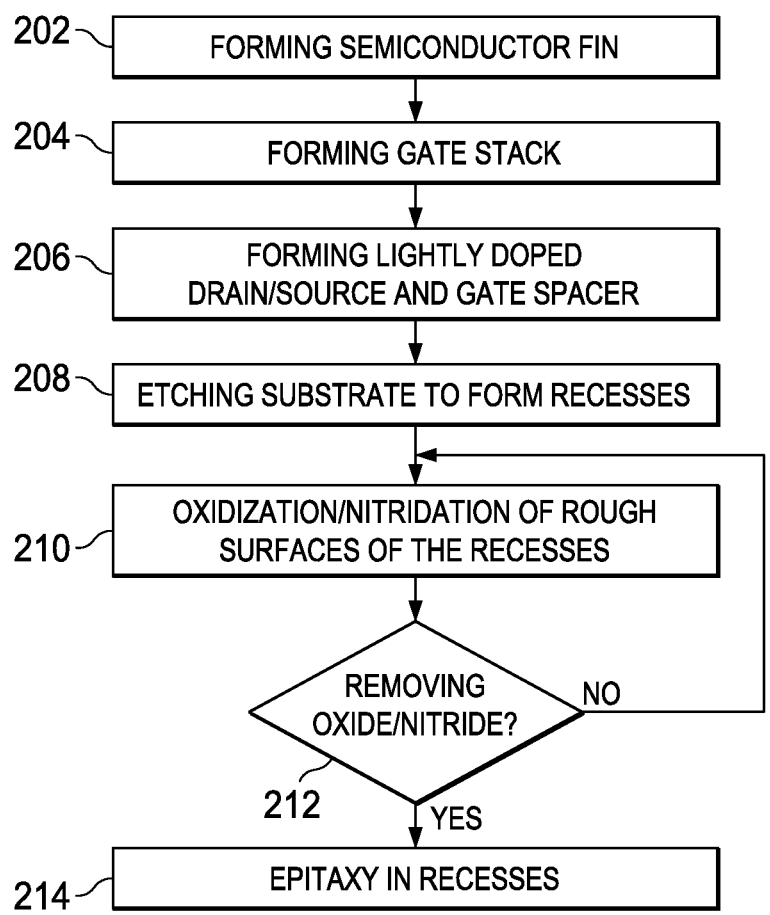
FIG. 13 illustrates a schematic flow chart showing the process flow in the formation of FinFETs in accordance with some embodiments.

A brief process flow in accordance with the embodiments of the present disclosure is depicted in a flow chart in FIG. 13. The process flow is briefly discussed as follows. Referring to step 202 of FIG. 13, a semiconductor fin is formed from a semiconductor substrate. The respective step is shown in FIGS. 1 and 2. Next, in step 204 of FIG. 13, gate stacks are formed on the semiconductor fin. The respective step is shown in FIGS. 3 and 4. Gate spacers and LDD regions are then formed, as shown in FIG. 4, which step is step 206 in FIG. 13. In step 208 of FIG. 13, recesses are formed in the semiconductor substrate, which step is shown in FIG. 5. An oxidation or nitridation is then performed to oxidize/nitridize rough surfaces of the recesses, as shown in FIG. 6 (step 210 in FIG. 13), followed by the removal of the resulting oxide layer and nitride layer, as shown in FIG. 7 (step 212 in FIG. 13). The oxidation/nitridation and the removal of the oxide/nitride layer may be repeated until the surface roughness of the recesses meet the design specification. An epitaxy is then performed to fill the recesses with a semiconductor material (FIG. 214 in FIG. 13).

In the embodiments of the present disclosure, by performing oxidation/nitridation in the recesses in semiconductor substrate, and removing the resulting oxide/nitride layers, the surface roughness of the resulting recesses is reduced. The resulting epitaxy regions formed in the recesses are more uniform, and the device uniformity throughout wafers and dies is improved.

In accordance with some embodiments, a method includes etching a semiconductor substrate to form a recess in the semiconductor substrate, and reacting a surface layer of the semiconductor substrate to generate a reacted layer. The surface layer of the semiconductor substrate is in the recess. The reacted layer is then removed. An epitaxy is performed to grow a semiconductor material in the recess.

In accordance with other embodiments, a method includes forming a gate stack over a semiconductor substrate, and etching the semiconductor substrate to form a recess in the semiconductor substrate. The recess is adjacent to the gate stack. The semiconductor substrate has a first surface in the recess, with the first surface having a first roughness. After the step of etching the semiconductor substrate, a first surface layer of the semiconductor substrate in the recess is removed to expose a second surface in the recess, wherein the second surface has a second roughness smaller than the first roughness. An epitaxy is performed to grow an epitaxy semiconductor region in the recess, wherein the epitaxy semiconductor region forms a source/drain region.

In accordance with yet other embodiments, a method includes forming a gate dielectric over a semiconductor substrate, forming a gate electrode over the gate dielectric, and forming a gate spacer on sidewalls of the gate dielectric and the gate electrode. The semiconductor substrate is etched to form a recess in the semiconductor substrate, wherein the recess is etched using the gate spacer as an etching mask. A reaction is performed on a surface layer of the semiconductor substrate to convert the surface layer into a reacted layer, wherein the reacted layer is in the recess. The method further includes removing the reacted layer, and performing an epitaxy to grow a semiconductor material in the recess.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method comprising:
   etching a semiconductor substrate to form a recess in the semiconductor substrate;
   reacting a first surface layer of the semiconductor substrate to generate a first reacted layer, wherein the first surface layer of the semiconductor substrate is in the recess;
   removing the first reacted layer, wherein a second surface layer of the semiconductor substrate is exposed after the removing the first reacted layer;
   reacting the second surface layer of the semiconductor substrate to generate a second reacted layer in the recess;
   removing the second reacted layer; and
   performing an epitaxy to grow a semiconductor material in the recess.

2. The method of claim 1, wherein the step of reacting the first surface layer comprises performing an oxidation on the first surface layer, and wherein the first reacted layer comprises an oxide of the first surface layer.

3. The method of claim 1, wherein the step of reacting the first surface layer comprises performing a nitridation on the first surface layer, and wherein the first reacted layer comprises a nitride of the first surface layer.

4. The method of claim 1 further comprising:
   forming a gate dielectric over the semiconductor substrate;
   forming a gate electrode over the gate dielectric; and
   forming a gate spacer on sidewalls of the gate dielectric and the gate electrode, wherein the recess is formed adjacent to the gate spacer.

5. The method of claim 1, wherein the semiconductor substrate comprises a semiconductor fin, and wherein the recess comprises a portion in the semiconductor fin.

6. The method of claim 1, wherein the step of reacting is performed using a dry etch, and wherein the step of removing the first reacted layer comprises a wet etch.

7. The method of claim 1, wherein after the removing the first reacted layer, all of the first reacted layer in the recess is removed.

8. A method comprising:
   forming a gate stack over a semiconductor substrate;
   etching the semiconductor substrate to form a recess in the semiconductor substrate, wherein the recess is adjacent to the gate stack, and wherein the semiconductor substrate has a first surface in the recess, with the first surface having a first roughness;
   after the step of etching the semiconductor substrate, removing a first surface layer of the semiconductor substrate to expose a second surface in the recess, wherein the first surface layer is in the recess, and wherein the second surface has a second roughness smaller than the first roughness; and
   performing an epitaxy to grow an epitaxy semiconductor region in the recess, wherein the epitaxy semiconductor region forms a source/drain region.

9. The method of claim 8, wherein the step of removing the first surface layer of the semiconductor substrate comprises:
   reacting the first surface layer with a process gas comprising an element to form a reacted layer, wherein the element is selected from the group consisting essentially of nitrogen and oxygen; and
   etching the reacted layer.

10. The method of claim 8, wherein during the step of removing the first surface layer of the semiconductor substrate, all exposed surface of the semiconductor substrate in the recess is recessed.

11. The method of claim 8 further comprising, after the first surface layer is removed, removing a second surface layer of the semiconductor substrate to expose a third surface in the recess, wherein the second surface layer is in the recess, and wherein the third surface has a third roughness smaller than the second roughness.

12. The method of claim 8, where the step of forming the gate stack comprises:
   forming a gate dielectric over the semiconductor substrate;
   forming a gate electrode over the gate dielectric; and
   forming a gate spacer on sidewalls of the gate dielectric and the gate electrode, wherein the recess is formed adjacent to the gate spacer.

13. The method of claim 8, wherein the semiconductor substrate comprises a semiconductor fin, and wherein the recess comprises a portion in the semiconductor fin.

14. The method of claim 8, wherein the step of etching the semiconductor substrate is performed using process gases, and wherein the step of removing the first surface layer is performed using a wet etch solution.

15. A method comprising:
   forming a gate dielectric over a semiconductor substrate;
   forming a gate electrode over the gate dielectric;
   forming a gate spacer on sidewalls of the gate dielectric and the gate electrode;
   etching the semiconductor substrate to form a recess in the semiconductor substrate, wherein the recess is etched using the gate spacer as an etching mask;
   performing a first reaction on a first surface layer of the semiconductor substrate to convert the first surface layer into a first reacted layer, wherein the first reacted layer is in the recess, wherein the etching the semiconductor substrate and the first reaction are performed in a same process chamber;
   removing the first reacted layer; and
   performing an epitaxy to grow a semiconductor material in the recess.

16. The method of claim 15, wherein the first reaction comprises an oxidation on the first surface layer, and wherein the first reacted layer comprises an oxide of the first surface layer.

17. The method of claim 15, wherein the first reaction comprises a nitridation on the first surface layer, and wherein the first reacted layer comprises a nitride of the first surface layer.

18. The method of claim 15, wherein a second surface layer of the semiconductor substrate is exposed after the step of removing the first reacted layer, and wherein the method further comprises:
   performing a second reaction on the second surface layer to convert the second surface layer into a second reacted layer, wherein the second reacted layer is in the recess; and
   removing the second reacted layer.

19. The method of claim 15, wherein the semiconductor substrate comprises a semiconductor fin, and wherein the recess comprises a portion in the semiconductor fin.

20. The method of claim 15, wherein after the etching the reacted layer, all of the first reacted layer in the recess is removed.

* * * * *